United States Patent
Schulman et al.

(10) Patent No.: US 6,734,470 B1
(45) Date of Patent: May 11, 2004

(54) LATERALLY VARYING MULTIPLE DIODES

(75) Inventors: Joel N. Schulman, Malibu, CA (US); David H. Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/397,898

(22) Filed: Sep. 17, 1999

(51) Int. Cl.$^7$ ............................................... H01L 29/88
(52) U.S. Cl. ........................ 257/104; 257/105; 257/106; 257/197
(58) Field of Search ................................ 257/104, 105, 257/197, 106

(56) References Cited

U.S. PATENT DOCUMENTS

| | | | |
|---|---|---|---|
| 5,204,543 A | * 4/1993 | Hanazawa et al. | 257/378 |
| 5,280,182 A | * 1/1994 | Waho | 257/197 |
| 5,554,860 A | * 9/1996 | Seabaugh | 257/197 |
| 5,981,969 A | * 11/1999 | Yuan et al. | 257/183 |
| 6,303,941 B1 | * 10/2001 | Xie et al. | 257/184 |

FOREIGN PATENT DOCUMENTS

JP         06120522 A * 4/1994 ......... H01L/29/804

OTHER PUBLICATIONS

B.Su, V.J. Goldman, and J.E. Cunningham, "Single–electron tunneling in nanometer–scale double–barrier heterostructure devices," Physical Review B, vol. 46, No. 12, Sep. 15, 1992.
K. Nomoto, K. Taira, T. Suzuki, I. Hase, H. Hiroshima, and M. Komuro, "Diameter dependence of current–voltage charateristics of ultrasmall area AlSb–InAs resonant tunneling diodes with diameters down to am," Appl. Phys. Lett. 70(15), Apr. 14, 1997.

T. Schmidt, M. Tewardt, R.J. Haug, K.V. Klitzing, B. Schonherr, P. Grambow, A. Forster, and H. Luth, "Peakto–valley ratio of small resonant–tunneling diodes with various barrier–thickness asymmetries." Appl. Phys. Lett. 68(6), Feb. 5, 1996.

M. Reddy, M.J. Muller, M.J.W. Rodwell, S.C. Martin, R.E. Muller, R.P. Smith, D.H. Chow, and J.N. Schulman, "Fabrication and dc, microwave characteristics of submicron Schottky–collector AIAs/In0.53GaGa/0.47As/InP resonant tunneling diodes ", J. Appl. Phys. 77(9), May 1, 1995.

* cited by examiner

*Primary Examiner*—Long Pham
*Assistant Examiner*—Nathan W. Ha
(74) *Attorney, Agent, or Firm*—Tope-McKay & Associates

(57) ABSTRACT

A method for producing laterally varying multiple diodes and their device embodiment are presented herein. As demonstrated, multiple resonant tunneling diodes are fabricated together utilizing a single epitaxial structure. Shallow, ion-implanted regions having varying depths, $d_x$, define the collector contacts. Each diode is isolated electrically from the others by methods such as conventional mesa etching into the emitter layer. The varying depths, $d_x$, provide means for varying the peak voltage of each individual diode. The peak voltage strongly depends on the depths, $d_x$, because it comprises a space charge region where the electric field is high, and therefore the voltage drop is high. The invention disclosed herein is useful in applications such as high-speed circuits such as comparators, analog to digital converters, sample and hold circuits, logic devices, and frequency multipliers.

2 Claims, 7 Drawing Sheets

LATERALLY VARYING MULTIPLE DIODES

TECHNICAL FIELD

The present invention is concerned with apparatus including semiconductor devices such as diodes. In particular, this invention relates to integrated multiple diodes, and more particularly to resonant tunneling diodes and systems utilizing resonant tunneling diode circuits with multistable states.

BACKGROUND OF THE INVENTION

A diode is a semiconductor device having a non-linear voltage-current relation. Diodes are important solid-state devices and have many electronic applications. The tunnel diode is a variety of diode with the unusual characteristic of negative differential resistance. Negative differential resistance is a voltage-current behavior where, over certain voltage ranges, increasing the voltage applied across the diode leads to decreased current carried through the diode. For certain voltage ranges, however, current flows relatively freely through the diode. In contrast, for most devices, increasing the voltage applied across the diode, within operating parameters, leads to increasing current regardless of the voltage range. Tunnel diodes, in general, have a number of applications, including high frequency oscillator circuits and high frequency electronic switches.

One type of tunnel diode is the double barrier tunnel diode, which generally includes a quantum well with thin barrier layers on either side. This structure is known as a double barrier structure and typically lies between two injection layers. The double barrier structure serves as an energy barrier to the flow of electrons that can be overcome only under certain conditions. Fulfillment of these conditions results in a negative differential resistance characteristic of interest over a range of external applied bias voltages. Electrons are injected into the double barrier structure from the conduction band of one of the injection layers under an internal electric field produced by the applied external bias voltage. The applied voltage increases the energy of the injected electrons such that they satisfy the resonant tunneling condition of the quantum barrier. Under such voltage conditions, the resonance condition is satisfied and an incoming electron has the same energy as an energy state of the quantum well. This condition enables electrons to tunnel through double barrier structure. As the bias voltage is increased further, the energy levels no longer match the energy state of the quantum well and the resonance condition is no longer satisfied. At this point the current decreases, resulting in the negative differential resistance effect.

Of particular interest are quantum well devices having current voltage characteristics including multiple negative differential resistance regions. Using traditional methods to achieve multiple negative differential resistance regions required complex circuitry. Therefore, development of a simpler, integrated circuit exhibiting multiple negative resistance regions was desirable. Such multiple regions may be obtained from a plurality of resonant states of a quantum well or from stacking several double barrier structures wells together. However, the resulting devices typically require much higher voltages corresponding to excited states as compared to the resonant voltage of a single quantum well.

In furtherance of the continuing trend towards miniaturization and increased functional density in electronic devices, much attention has been directed toward resonant-tunneling devices as characterized by operation involving a particular carrier energy coinciding with a particular quantized energy level in a potential well. Extensive literature has been developed surrounding both the theoretical and practical device aspects as surveyed, e.g., by:

F. Capasso et al., "Resonant Tunneling Through Phenomena . . . in Superlattices, and Their Device Applications", *IEEE Journal of Quantum Electronics*, Vol. QE-22 (1986), pp. 1853–1869.

Also, noting that resonant-tunneling devices may be made as diodes and as transistors; see, e.g., E. R. Brown et al., "Millimeter-band Oscillations Based on Resonant Tunneling in a Double-barrier Diode at Room Temperature", *Applied Physics Letters*, Vol. 50 (1987), pp. 83–85;

H. Toyoshima et al., "New Resonant Tunneling Diode with a Deep Quantum Well", *Japanese Journal of Applied Physics*, Vol. 25 (1986), pp. L786–788;

H. Morkoc et al., "Observation of a Negative Differential Resistance Due to Tunneling through a Single Barrier into a Quantum Well", *Applied Physics Letters*, Vol. 49 (1986), pp. 70–72;

F. Capasso et al., "Resonant Tunneling Transistor with Quantum Well Base and High-energy Injection: A New Negative Differential Resistance Device", *Journal of Applied Physics*, Vol. 58 (1985), pp. 1366–1368;

N. Yokoyama et al., "A new Functional, Resonant-Tunneling Hot Electron Transistor (RHET)", *Japanese Journal of Applied Physics*, Vol. 24 (1985), pp. L853–L854;

F. Capasso et al., "Quantum-well Resonant Tunneling Bipolar Transistor Operating at Room Temperature", *IEEE Electron Device Letters*, Vol. EDL-7 (1986), pp. 573–575;

T. Futatsugi et al., "A Resonant-Tunneling Bipolar Transistor (RBT): A Proposal and Demonstration for New Functional Devices with High Current Gains", *Technical Digest of the 1986 International Electron Devices Meeting*, pp. 286–289;

T. K. Woodward et al., "Experimental Realization of a Resonant Tunneling Transistor", *Applied Physics Letters*, Vol. 50 (1987), pp. 451–453;

B. Vinter et al., "Tunneling Transfer Field-effect Transistor: A Negative Transconductance Device", *Applied Physics Letters*, Vol. 50 (1987), pp. 410–412;

A. R. Bonnefoi et al., "Inverted Base-collector Tunnel Transistors", *Applied Physics Letters*, Vol. 47 (1985), pp. 888–890;

S. Luryi et al., "Resonant Tunneling of Two-dimensional Electrons through a Quantum Wire: A Negative Transconductance Device", *Applied Physics Letters*, Vol. 47 (1985), pp. 1347–1693; and S. Luryi et al., "Charge Injection Transistor Based on Real-Space Hot-Electron Transfer", *IEEE Transactions on Electron Devices*, Vol. ED-31 (1984), pp. 832–839.

Of particular interest are integrated devices having multiple negative differential resistance current-voltage characteristics in order to obtain circuits with multistable states. Multiple resonant tunneling diodes in series are a well-known circuit component for supplying multistable states for digital logic and signal processing. The total voltage can be distributed across the circuit elements in more than one way, depending on the history of the circuit, thus defining the multistable states. For some circuit applications it is preferable to control the total current instead of the total voltage. Also, the total of the voltages across the series of resonant tunneling diodes add together and can become too high for convenient processing by the rest of the circuit. It is natural to then consider a pair of resonant tunneling diodes in a parallel arrangement instead of in series. The most efficient way to do this is to grow one resonant tunneling diode epitaxial structure and then divide it up electrically using lithography. However, two such identical resonant tunneling diodes in parallel are basically equivalent to one resonant tunneling diode with a combined area of the two, unless something is done to differentiate them. The I(V) curves of the two or more resonant tunneling diodes must have different shapes, i.e., the peak and valley voltages differing, not just by a scale factor on the current. Then, they will naturally not behave similarly under the same bias. For example, a given bias voltage might put one resonant tunneling diode near its peak current while the other was near its valley current.

An example of previous methods for obtaining multiple stable solutions by putting two resonant-tunneling diodes in parallel is that of Capasso et al., U.S. Pat. No. 4,902,912 in which the two resonant-tunneling diodes are separated by a resistance consisting of a low doped region between the resonant-tunneling diodes. FIG. 1(a) provides a basic circuit diagram of this concept. Although the current out of the contact exhibits double peaks and multiple stable states for certain voltage differences, the required use of multiple voltage sources increases the complexity of the device. Additionally, the device is not easily adjustable or controllable. An attempt to improve on the concept developed by Capasso et al. was made by J. Soderstrom and T. Anderson, as discussed in Electron Device Letters, Vol. 9, No. 5, May 1988. FIG. 1(b) provides a basic circuit diagram of this concept. Soderstrom and Anderson introduced two resistors in series with the resonant-tunneling diodes. By choosing the resistors properly, they caused the circuit to produce a double peak curve. However, this concept has the disadvantage that the resistors introduce hysteresis, which causes the presence of different peak voltages for forward and backward voltage sweeps, and also decreases the speed of the device due to the RC time constant. The structure of Soderstrom and Anderson use lightly doped regions in order to vary the resistance for each of the diodes.

Accordingly, it is an object of the present invention to provide an integrated circuit including laterally varying diodes with multiple current-voltage characteristics that can be tailored for multiple stable solutions. Specifically, the diodes utilized for demonstration here are of the resonant tunneling type. It is another object of the present invention to provide apparatus in accordance with the invention, which give examples of its usage.

SUMMARY OF THE PRESENT INVENTION

The present invention provides a plurality of laterally varying diodes and a method for producing them. The plurality of laterally varying diodes includes, in common, an n– collector region formed on a diode region, with the n– collector region having a contact surface opposite the diode region and a depth extending from the contact surface to the diode region. Each of the individual diodes includes an independently selectable portion of the depth with an ion-implanted portion. The plurality of laterally varying diodes further including means for substantially electrically isolating each individual diode.

The method for producing a plurality of laterally varying diodes includes the steps of providing a wafer having a diode region and a n– collector region having a depth; masking the wafer to isolate the effects of ion-implantation to the desired portion of the n– collector region; ion-implanting the desired portion of the n– collector region to a desired depth; repeating the masking and ion-implantation steps a desired number of times to produce a desired number of ion-implanted portions in the n– collector region; and providing means for electrically isolating the individual portions of the diode region and the n– collector region corresponding to the ion-implanted portions in the n– collector region.

A second method for producing a plurality of laterally varying diodes includes the steps of providing a wafer having a diode region and a n– collector region having a depth; masking a portion of the n– collector region; etching the non-masked portion of the n– collector region to desired depth; repeating the masking and etching steps a for a desired number of portions of the n– collector region; uniformly ion-implanting the desired n– collector regions; and providing means for electrically isolating the individual portions of the diode region and the n– collector region corresponding to the ion-implanted portions in the n– collector region.

The present invention may be used to develop a variety of diode types. It is discussed herein in terms of the provision of a plurality of laterally varying resonant tunneling diodes.

DETAILED DESCRIPTION

The present invention relates to laterally varying multiple diodes, as well as to apparatus incorporating them therein. The diodes presented herein are fabricated as resonant tunneling diodes in a single unit such that the each individual diode may have a different voltage for its peak current value. Although resonant tunneling diodes are shown in this description for purposes of illustration, the present invention is readily adaptable to other diode types. The following description is presented to enable one of ordinary skill in the art to make and use the invention and to incorporate it in the context of particular applications. Various modifications to the preferred embodiment, as well as a variety of uses in different applications will be readily apparent to those skilled in the art, and the general principles defined herein may be applied to other embodiments. Thus, the present invention is not intended to be limited to the embodiments shown, but is to be accorded the widest scope consistent with the principles and novel features disclosed herein.

The present invention provides an electronic circuit component comprised of a plurality of diodes, specifically in the form of resonant tunneling diodes fabricated together such that each of the individual diode has a different peak current voltage value. Resonant tunneling diodes are currently utilized in a variety of applications, including multi-stable state logic devices and high speed circuits for signal processing such as comparators, analog to digital converters, sample and hold circuits, and frequency multipliers.

Figure 1:
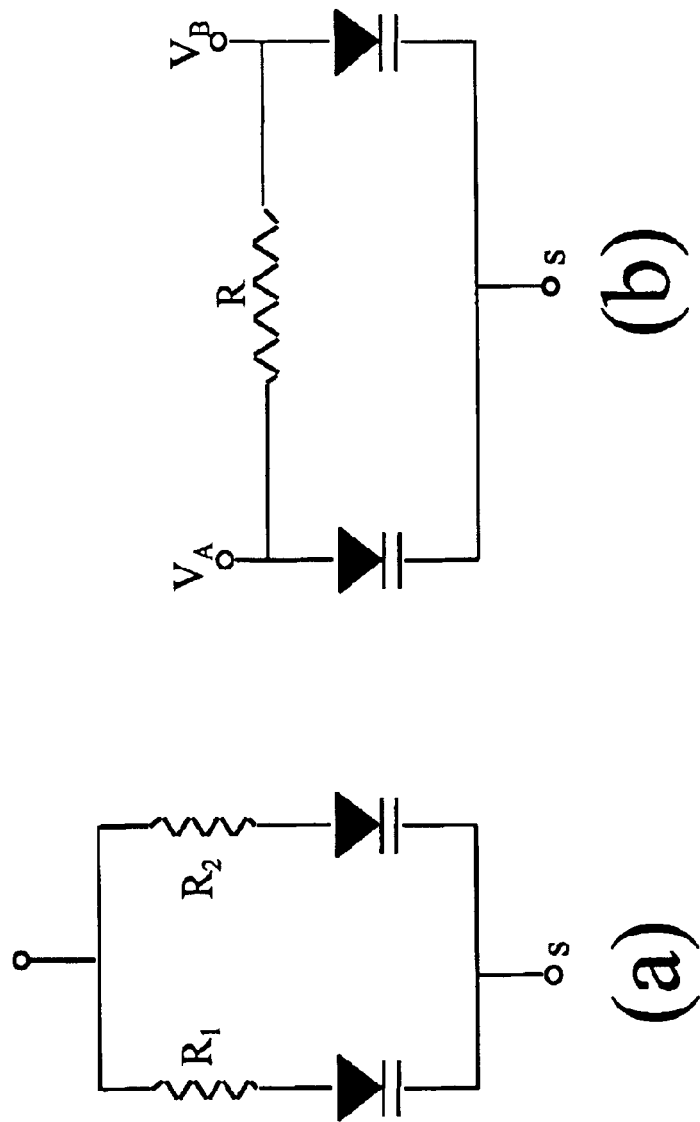
FIG. 1(a) provides a circuit diagram basically illustrating the concept by Capasso et al., further described in U.S. Pat. No. 4,902,912.
FIG. 1(b) provides a circuit diagram basically illustrating the concept by Soderstrom et al.
Figure 2:
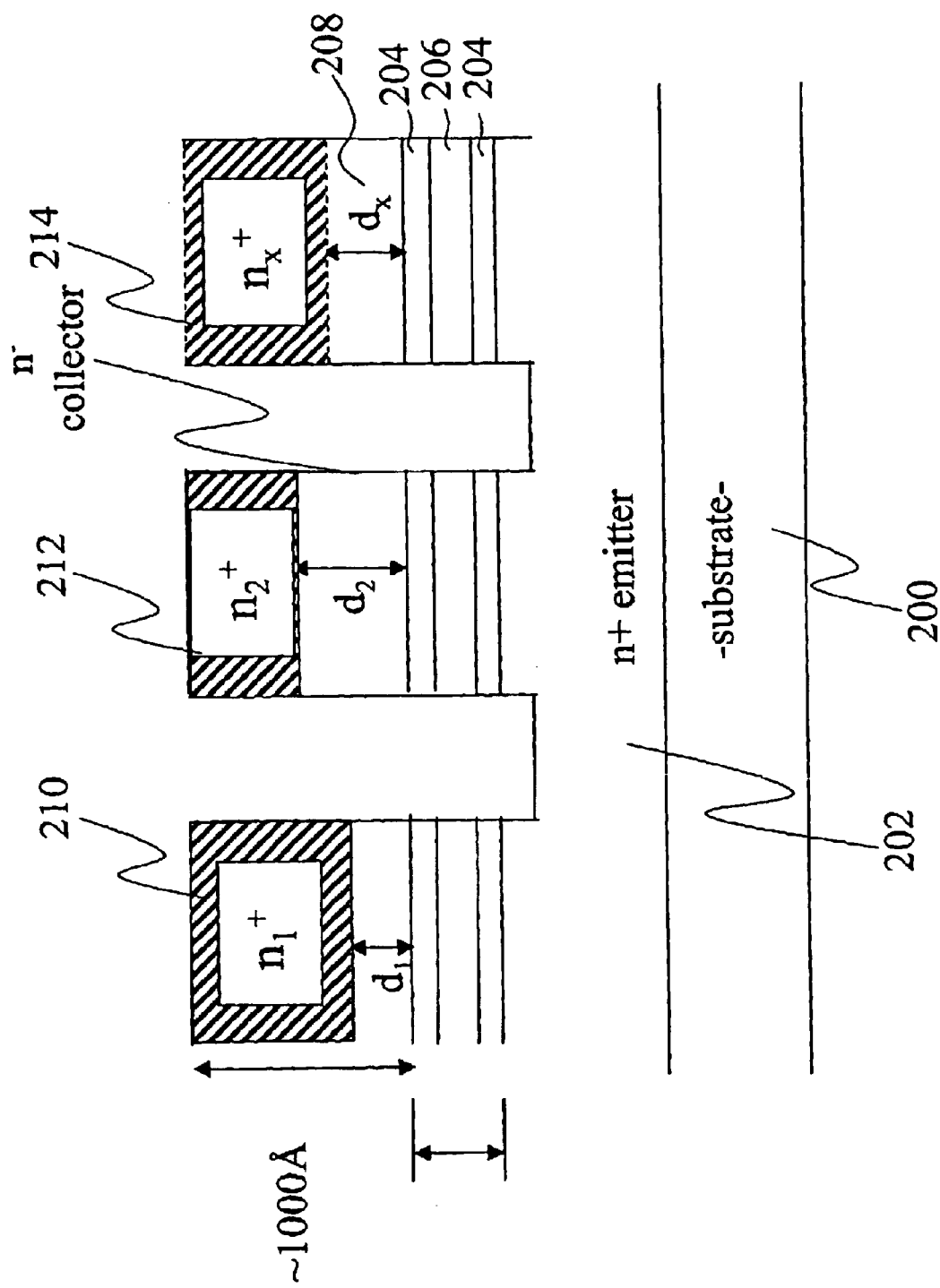
FIG. 2 provides a layer diagram of a generic embodiment of the present invention, demonstrating the ion-implanted regions.

FIG. 2 provides a layer diagram of a generic embodiment of the present invention, demonstrating the ion-implanted regions. It includes, from the bottom up, the substrate 200, the highly n-doped type emitter 202, the double barriers 204 and well 206, the lightly ($\sim 1\times10^{17}$ cm$^{-3}$) doped part of the collector 208, and finally first 210, second 212, and $x^{th}$ 214 shallow ion-implanted regions (n$^+$$\sim$1$\times$10$^{19}$ cm$^{-3}$) which define the plurality x resonant tunneling diode collector contacts. Conventional mesa etching into the n$^{++}$ emitter layer would subsequently electrically isolate the x resonant tunneling diodes as shown in FIG. 2. The number x of diodes which are grown on the same epitaxial structure may be chosen based on the needs of a particular application. The distances, labeled $d_1$, $d_2$, and $d_x$, between the ion-implanted regions 210, 212, and 214 and the nearest barrier 204 of each diode may be chosen independently to vary the characteristics of each diode With x different resonant tunneling diodes grown on one substrate, designs utilizing all x types could then easily be implemented by specifying the collector implant depths $d_1$, $d_2$, and $d_x$. The main principle is that the peak voltage of each resonant tunneling diode can be tailored by varying the length $d_x$ for each resonant tunneling diode. The voltage strongly depends on this length because it comprises a space charge region where the electric field is high, and therefore the voltage drop is high.

Figure 3:
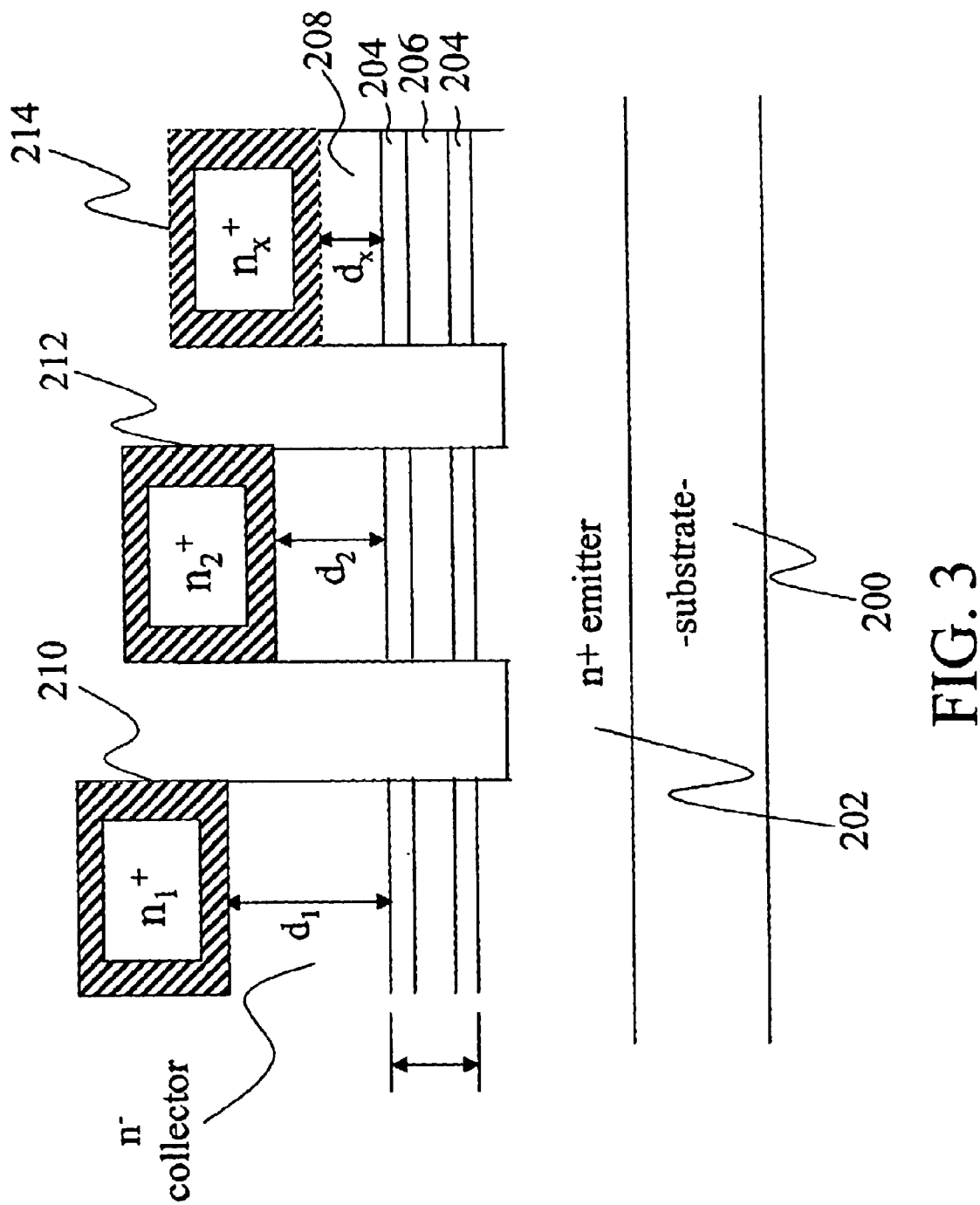
FIG. 3 provides a layer diagram of a generic embodiment of the present invention, demonstrating the ion-implanted regions as produced by an alternative method.

The implantation process of the present invention may be performed in a number of ways, two of which have been found particularly useful. In the first method, each portion of the n– collector region 208 corresponding to a different diode structure is independently masked and implanted to the depth necessary to create the desired distances $d_x$ for each. In the second method, the surface of the n– collector region 208 is masked and etched to a desired depth, and the ion implantation is performed uniformly across the different diode structures. A general overview of a series of laterally varying resonant tunneling diodes produced by the second method is shown in FIG. 3 with all elements corresponding to the same in FIG. 2. After implantation, the diodes produced are electrically isolated from each other by means of etching or any other suitable process.

Figure 4:
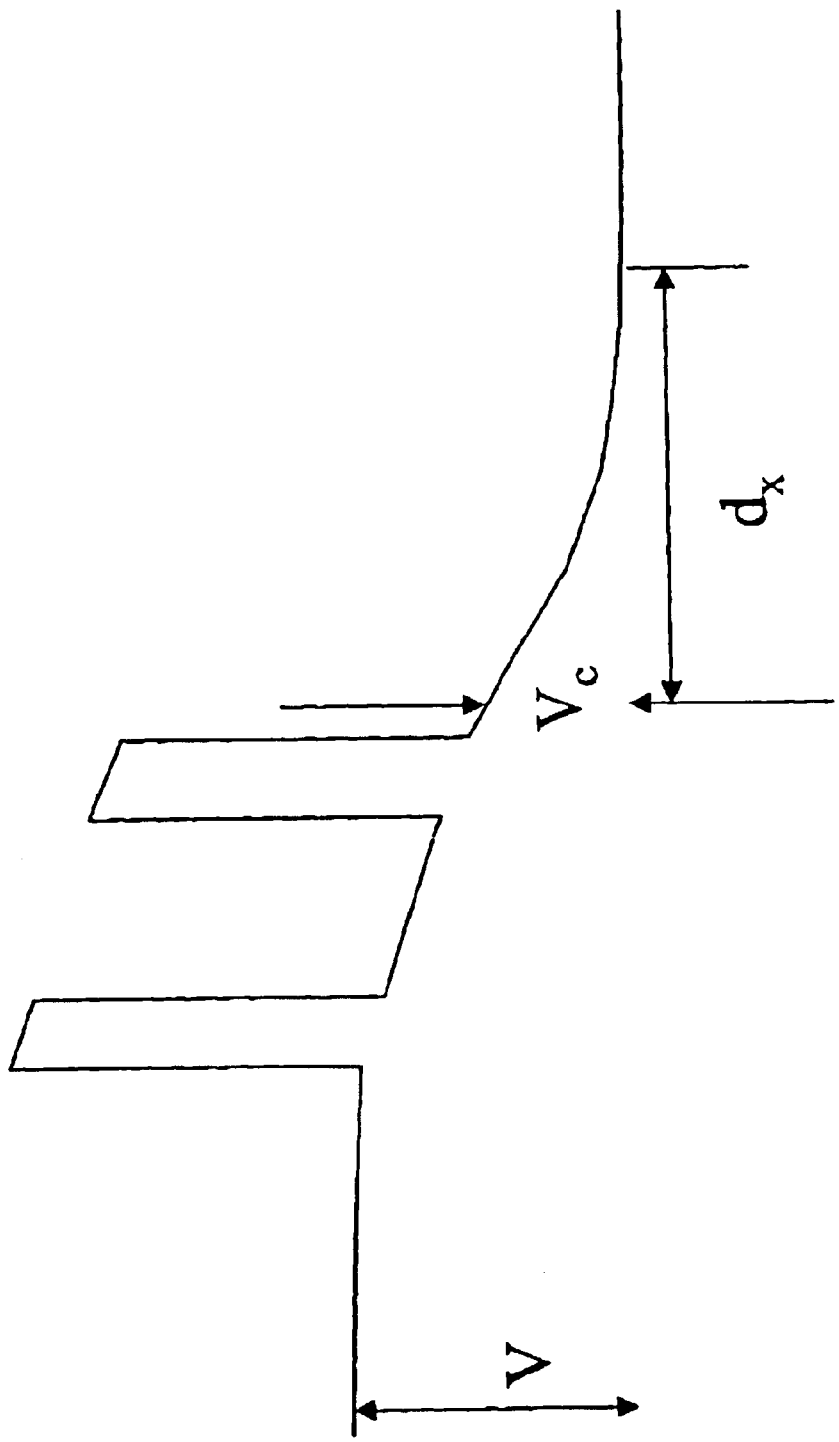
FIG. 4 provides a band-edge diagram demonstrating a typical resonant tunneling diode and the band-bending effect caused by the configuration of the present invention.

The FIG. 4 illustrates general characteristics of an individual one of the plurality of laterally varying diodes shown in FIGS. 2 and 3 by showing a typical representative resonant tunneling diode band-edge diagram. The electric field is approximately constant, and the voltage drop linear across the lightly doped region, which includes the double barrier 204, the well 206, and the non-ion-implanted portion of the n– collector region 208. It is not uncommon for the length $d_x$ to be several times the width of the double barriers 204 and well 206, and therefore contain the majority of the voltage drop. The border with the highly doped ion implanted region, where the energy band quickly flattens out, determines the length $d_x$.

Figure 5:
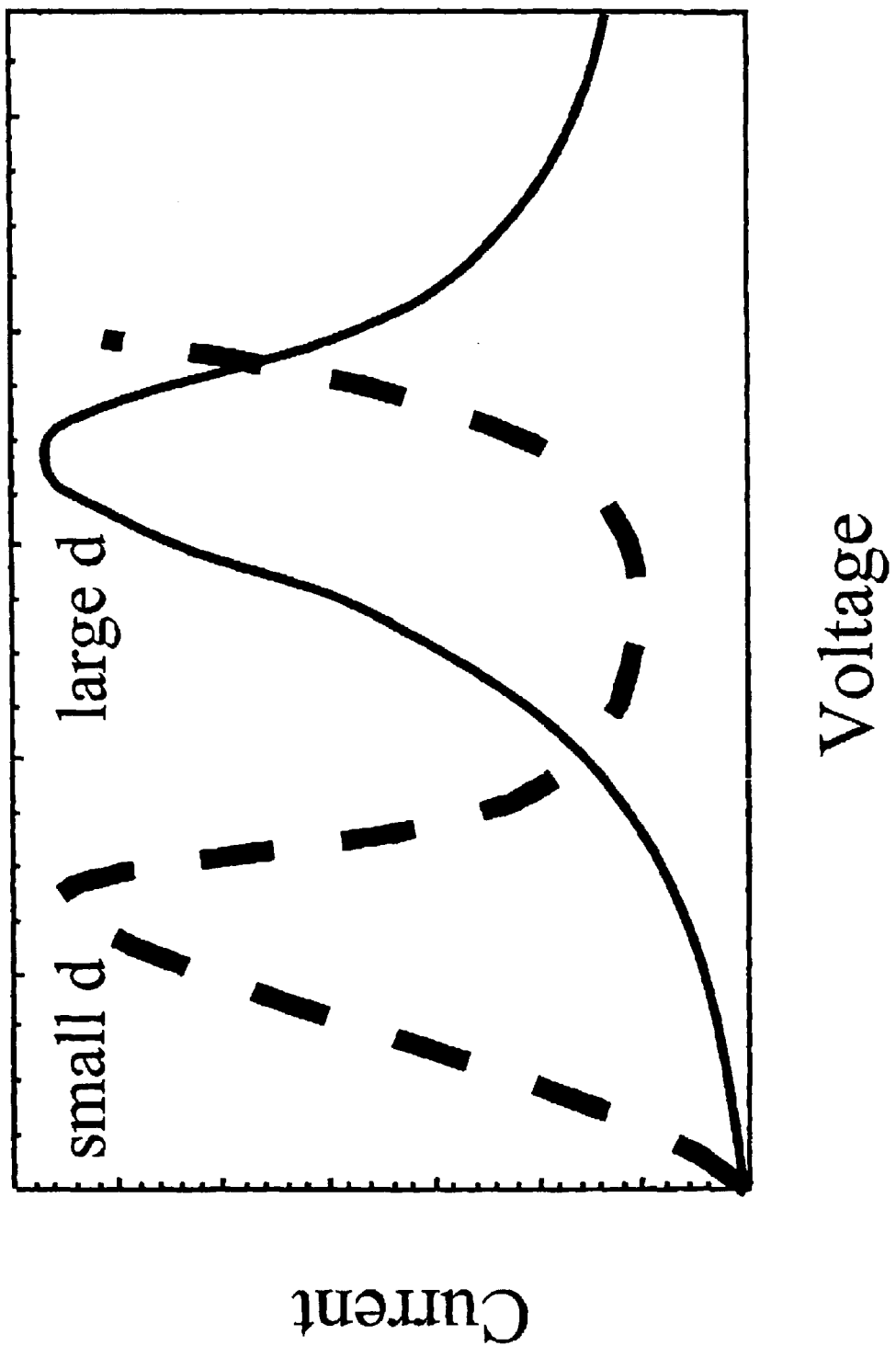
FIG. 5 provides a current-voltage (I(V)) diagram illustrating curves for two laterally varying diodes, which may be developed by the present invention.

An example of typical current-voltage (I(V)) curves obtainable appear as shown in FIG. 5. If the lateral widths of the highly doped regions are chosen as equal, the peak currents of the two resonant tunneling diodes will be very similar to those shown. The currents will also be approximately proportional to the area of the ion-implanted portion as viewed from the top of a wafer. It is important to note that FIGS. 2, 3, 4, and 5 are provided specifically to give qualitative representations of the structure and curves obtainable with the present invention. Those actually produced will vary depending on the particular application.

Figure 6:
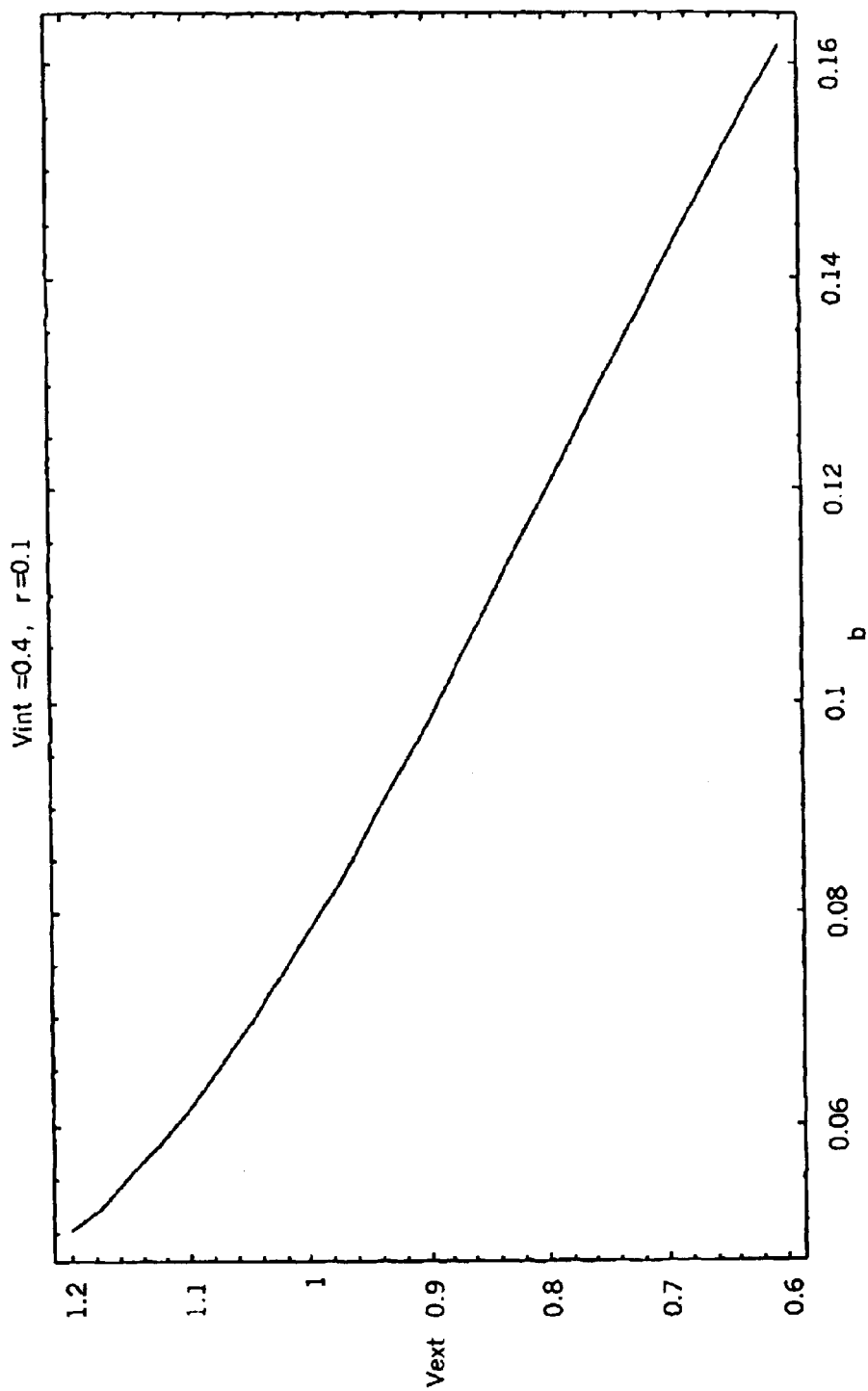
FIG. 6 provides a graph showing the variation of the external voltage over a diode for various levels of the main depth, while the internal voltage over the diode and the trailing region are held constant.
Figure 7:
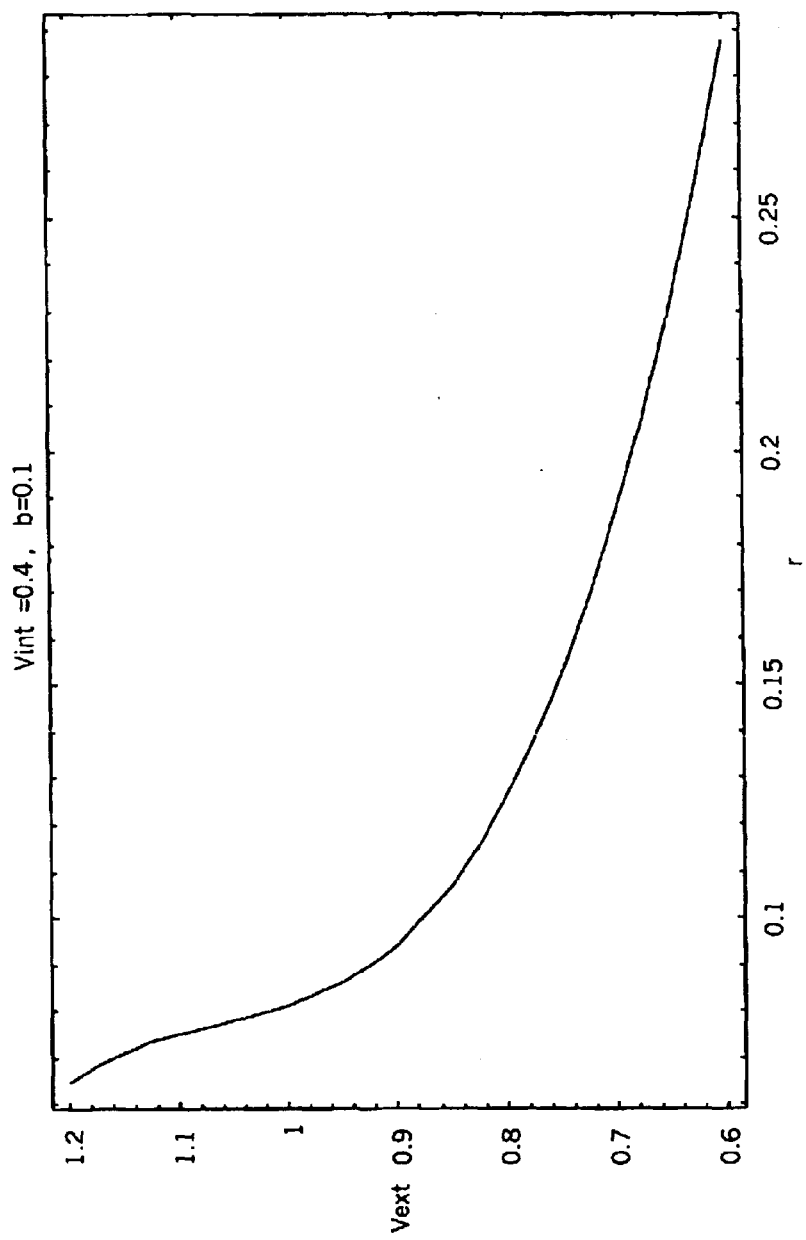
FIG. 7 provides a graph showing the external voltage over a diode for various levels of the trailing region, while the internal voltage over the diode and the main depth are held constant.

Although represented in FIGS. 2 and 3 as a uniform block, the ion-implantation process inherently results in an ion count that varies with depth. FIGS. 6 and 7 provide an illustration showing an example of a modeled effect of this variation. The implant region may be modeled as having a main depth and a trailing region. The main depth is the depth into the n– collector region where the implantation is roughly uniform, and the trailing region is the area beyond the main depth where the implantation level falls off and approaches zero. In FIGS. 6 and 7, the main depth is labeled b, and the trailing region is labeled r. The units for both b and r are microns. FIG. 6 provides a graph showing the variation of the external voltage over a diode for various levels of the main depth b, while the internal voltage over the diode is selected at 0.4 and the trailing region r is held at 0.1 microns. FIG. 7 provides a graph showing the external voltage over a diode for various levels of the trailing region r, while the internal voltage over the diode is selected at 0.4 and the main depth b is held at 0.1 microns.

What is claimed is:
1. A plurality of laterally varying diodes each comprising an n– collector region formed on a diode region, wherein each individual diode region has an independently selectable depth including an ion-implanted portion, and each n– collector region has a depth extending from the diode region to a contact surface that is co-planar with the contact surfaces of the other n– collector regions, the plurality of laterally varying diodes further comprising means for substantially electrically isolating each individual diode.

2. A plurality of laterally varying diodes as set forth in claim 1, wherein the diode region is formed as a resonant tunneling diode region.

\* \* \* \* \*